United States Patent
Utsunomiya

(10) Patent No.: US 10,008,466 B2
(45) Date of Patent: Jun. 26, 2018

(54) SEMICONDUCTOR DEVICE AND MANUFACTURING METHOD THEREOF

(71) Applicant: RENESAS ELECTRONICS CORPORATION, Tokyo (JP)

(72) Inventor: Hiroyuki Utsunomiya, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/729,127

(22) Filed: Oct. 10, 2017

(65) Prior Publication Data

US 2018/0047691 A1 Feb. 15, 2018

Related U.S. Application Data

(62) Division of application No. 15/098,138, filed on Apr. 13, 2016, now Pat. No. 9,818,709.

(30) Foreign Application Priority Data

Apr. 30, 2015 (JP) .................................. 2015-093059

(51) Int. Cl.
*H01L 21/44* (2006.01)
*H01L 21/4763* (2006.01)
(Continued)

(52) U.S. Cl.
CPC .............. *H01L 24/13* (2013.01); *H01L 24/11* (2013.01); *H01L 24/03* (2013.01); *H01L 24/05* (2013.01); *H01L 2224/0345* (2013.01); *H01L 2224/03462* (2013.01); *H01L 2224/03831* (2013.01); *H01L 2224/03912* (2013.01); *H01L 2224/0401* (2013.01); *H01L 2224/05572* (2013.01);
(Continued)

(58) Field of Classification Search
CPC ......... H01L 24/05; H01L 24/07; H01L 24/10; H01L 24/11; H01L 24/13; H01L 24/15; H01L 24/16; H01L 2924/01028; H01L 2924/01029; H01L 2924/01047
USPC ......... 438/612–614, 627, 653; 257/737, 738, 257/751, 762, 766, 780
See application file for complete search history.

(56) References Cited

U.S. PATENT DOCUMENTS 6,940,169 B2  9/2005  Jin et al.
8,241,963 B2  8/2012  Shen et al.
(Continued)

FOREIGN PATENT DOCUMENTS

| JP | 2012-069704 A | 4/2012 |
| JP | 2013-187353 A | 9/2013 |
| JP | 2014-179364 A | 9/2014 |

OTHER PUBLICATIONS

Notice of Allowance issued in U.S. Appl. No. 15/098,138, dated Jul. 10, 2017.
(Continued)

*Primary Examiner* — Hsien Ming Lee
(74) *Attorney, Agent, or Firm* — McDermott Will & Emery LLP

(57) ABSTRACT

A flip-chip mounting technique with high reliability is provided in flip-chip mounting using a Cu pillar. In a semiconductor device to be coupled to a mounting board via a Cu pillar, the Cu pillar is caused to have a laminated structure including a pillar layer, a barrier layer, and a bump in this order from below, and the bump is formed to be smaller than the barrier layer.

15 Claims, 15 Drawing Sheets

(51) Int. Cl.
*H01L 23/48* (2006.01)
*H01L 23/52* (2006.01)
*H01L 23/00* (2006.01)

(52) U.S. Cl.
CPC ........... *H01L 2224/05647* (2013.01); *H01L 2224/10145* (2013.01); *H01L 2224/1147* (2013.01); *H01L 2224/11462* (2013.01); *H01L 2224/11849* (2013.01); *H01L 2224/11903* (2013.01); *H01L 2224/131* (2013.01); *H01L 2224/13005* (2013.01); *H01L 2224/13014* (2013.01); *H01L 2224/13017* (2013.01); *H01L 2224/13018* (2013.01); *H01L 2224/13083* (2013.01); *H01L 2224/13147* (2013.01); *H01L 2224/13155* (2013.01); *H01L 2224/16237* (2013.01); *H01L 2224/81191* (2013.01); *H01L 2224/81193* (2013.01); *H01L 2224/81424* (2013.01); *H01L 2224/81444* (2013.01); *H01L 2224/81447* (2013.01); *H01L 2224/81455* (2013.01); *H01L 2224/81469* (2013.01); *H01L 2924/206* (2013.01)

(56) References Cited

U.S. PATENT DOCUMENTS

| | | | |
|---|---|---|---|
| 8,492,891 | B2 | 7/2013 | Lu et al. |
| 9,472,521 | B2* | 10/2016 | Chuang .................. H01L 24/05 |
| 2012/0068334 | A1 | 3/2012 | Migita et al. |
| 2012/0178251 | A1 | 7/2012 | Lim et al. |
| 2014/0159235 | A1* | 6/2014 | Odaira .................. H01L 24/13 257/737 |
| 2014/0332713 | A1* | 11/2014 | Mizutani .................. C23F 1/44 252/79.3 |

OTHER PUBLICATIONS

Final Office Action issued in U.S. Appl. No. 15/098,138, dated May 11, 2017.
Non-Final Office Action issued in U.S. Appl. No. 15/098,138, dated Jan. 23, 2017.

* cited by examiner

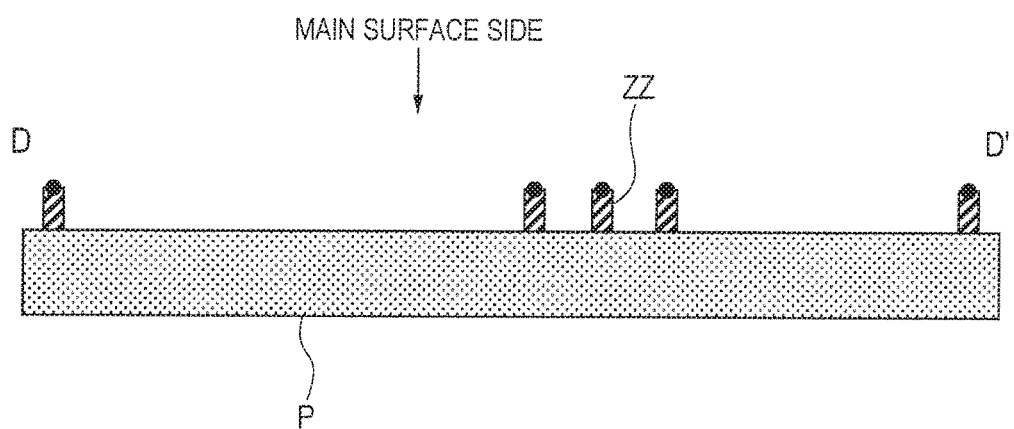
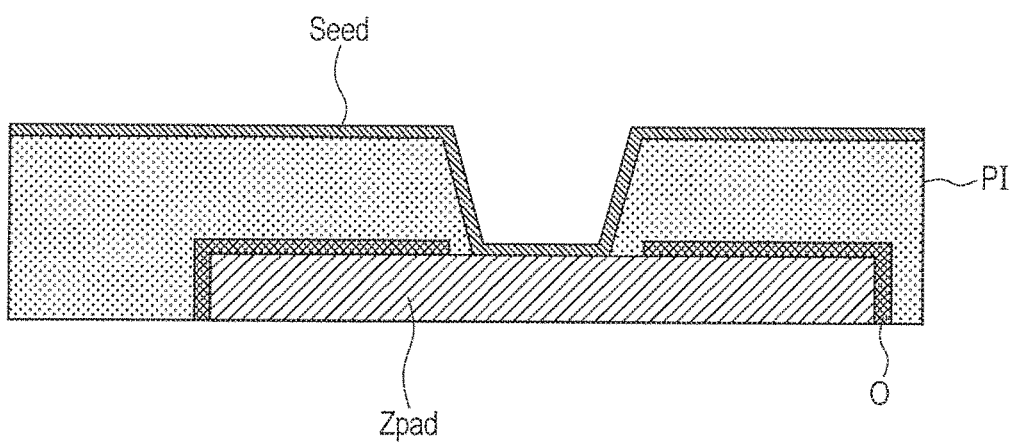

SEMICONDUCTOR DEVICE AND MANUFACTURING METHOD THEREOF

CROSS-REFERENCE TO RELATED APPLICATIONS

This application is a divisional of U.S. application Ser. No. 15/098,138, filed on Apr. 13, 2016, which claims the benefit of Japanese Patent Application No. 2015-093059 filed on Apr. 30, 2015 including the specification, drawings and abstract is incorporated. herein by reference in its entirety.

BACKGROUND

The present invention relates to a semiconductor device and a manufacturing method thereof, and in particular, to flip-chip mounting for a semiconductor device in which electrode pads are arranged at a narrow pitch.

With the spread of small and high-performance electronic apparatuses, a semiconductor packaging technique in the apparatuses has recently become important, which creates a big challenge improving a technique for coupling a semiconductor chip and a mounting board.

As one of the techniques for dealing with an increase in the number of coupling terminals and a narrow pitch between electrode pads, those having been brought by high integration of semiconductor chips, a flip-chip mounting technique using a Cu pillar is under development.

In a Cu pillar, a pillar made of Cu is formed, by using a plating process, over a terminal pad of a semiconductor chip in order to be coupled to a mounting board, and hence the Cu pillar can deal with a narrow pitch, and can deal with a larger current because Cu is used as a material, in comparison with Au or solder.

As a related art of the field of the technology, a technique as disclosed in Patent Document 1 can be cited. Patent Document 1 discloses "A semiconductor device in which a ratio of the diameter (top diameter) of a portion of a solder bump, the portion being farthest from a semiconductor substrate, to the diameter (bottom diameter) of the bottom of the solder bump is 1:1 to 1:4."

Further, Patent Document 2 discloses "A coupling terminal of a semiconductor device having a shape in which the cross-sectional area of a first cross section, the cross section being parallel to the surface of a protective film at an end portion contacting a solder terminal, is larger than the cross-sectional area of a second cross section located in the same plane as the surface of the protective film."

Furthermore, Patent Document 3 discloses "A semiconductor chip in which the angle between the upper end surface of a pillar part and a side surface contacting the upper end surface is an acute angle."

RELATED ART DOCUMENT

Patent Document

[Patent Document 1] Japanese Unexamined Patent Application Publication No. 2012-69704
[Patent Document 2] Japanese Unexamined Patent Application Publication No. 2013-187353
[Patent Document 3] Japanese Unexamined Patent Application Publication No. 2014-179364

SUMMARY

Flip-chip mounting using a Cu pillar have the following challenges.

When a semiconductor chip is bonded to a mounting board by solder, there is the fear that the solder in the semiconductor chip and that in the mounting board may move laterally at the outer peripheries of them due to a difference between the thermal expansion coefficients thereof, so that the solder may extend beyond the barrier layer of a Cu pillar and be adhered to the sidewall of a pillar layer, thereby causing a decrease in a short margin with the solder protruding laterally.

Additionally, if the solder reaches the surface of the chip by so-called wet rise of the solder over the sidewall of the pillar, in which the solder proceeds along the pillar layer, the adhesiveness between the semiconductor chip and the Cu pillar may be decreased by the alloying of the solder and the Cu pillar, thereby causing a decrease in the reliability of a semiconductor device.

Other challenges and new characteristics will become clear from the description and accompanying drawings of the present specification.

According to one embodiment, in a semiconductor device to be coupled to a mounting board via a Cu pillar, the Cu pillar is formed to have a laminated structure including a pillar layer, a barrier layer, and a bump in this order from below, in which the bump is formed to be smaller than the barrier layer.

According to the one embodiment, flip-chip mounting with high reliability can be performed in flip-chip mounting using a Cu pillar.

BRIEF DESCRIPTION OF THE DRAWINGS

FIG. 9 is a sectional view, taken along D-D' Line in FIG. 8;

FIG. 10A is a sectional view illustrating part of manufacturing steps of the semiconductor device according to one embodiment of the invention;

DETAILED DESCRIPTION

Figure 1:
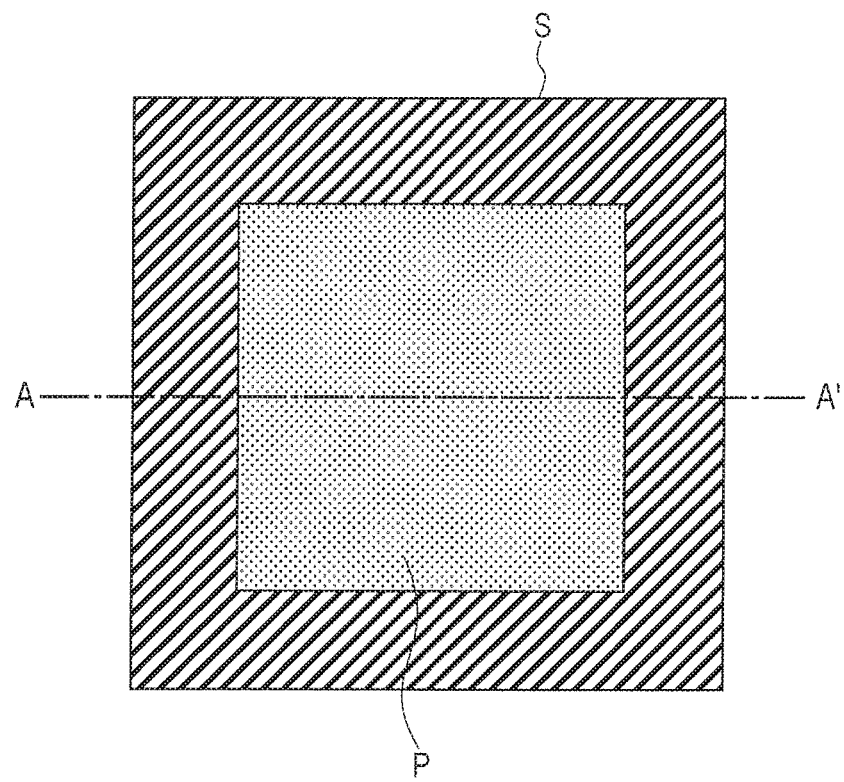
FIG. 1 is a schematic configuration view of a semiconductor device according to one embodiment of the present invention.

Hereinafter, embodiments of the present invention will be described with reference to the accompanying views. In each view, members having the same configuration as each other are denoted with the same reference numeral, and detailed description of overlapping portions will be omitted.

First Embodiment

Figure 2:
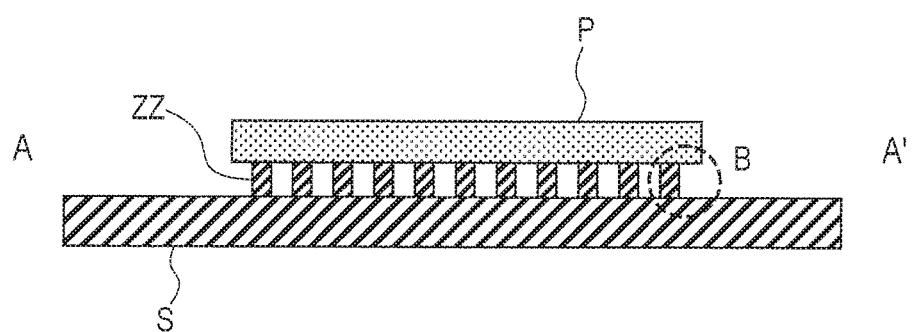
FIG. 2 is a sectional view, taken along A-A' Line in FIG. 1.
Figure 3:
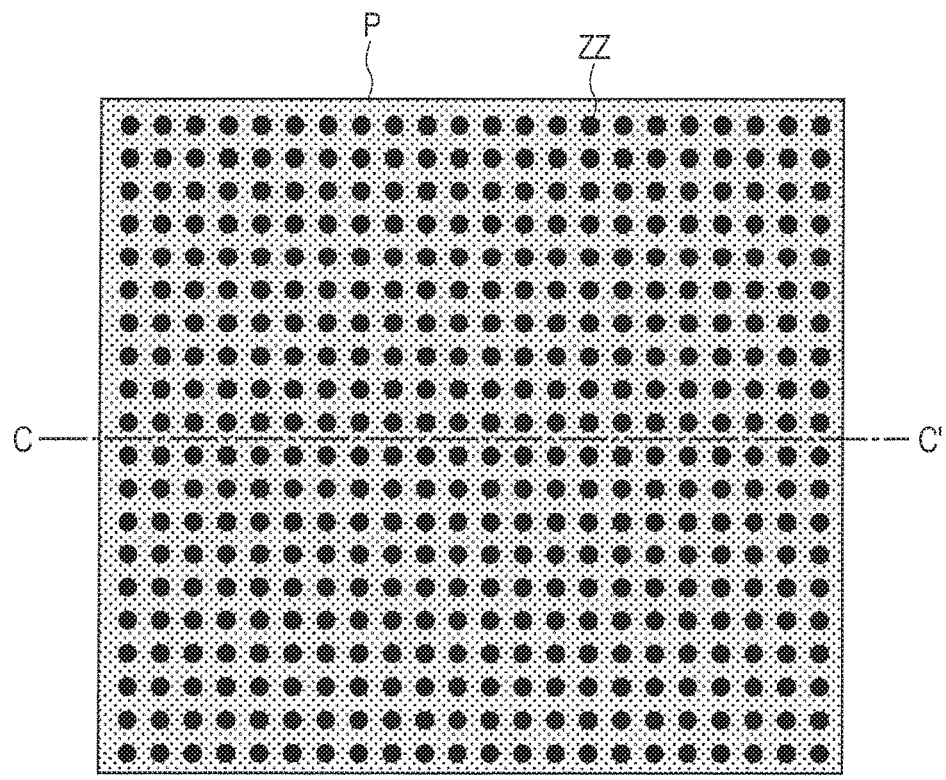
FIG. 3 is a plan view of a semiconductor pellet according to one embodiment of the invention.
Figure 4:
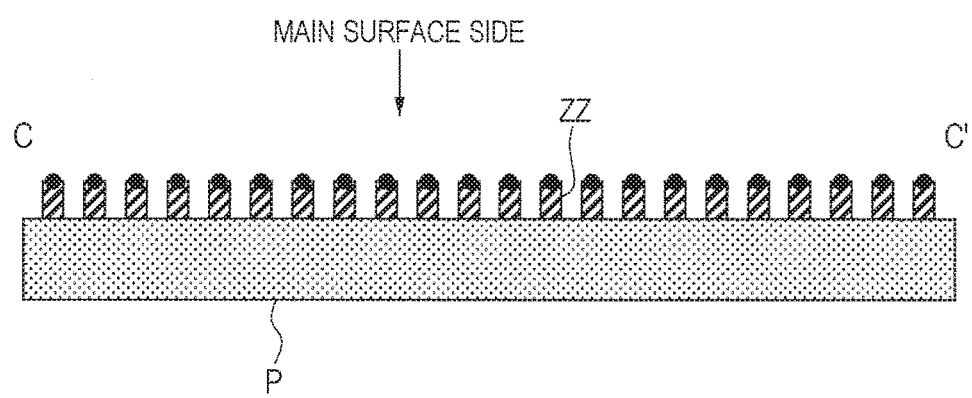
FIG. 4 is a sectional view, taken along C-C' Line in FIG. 3.
Figure 5:
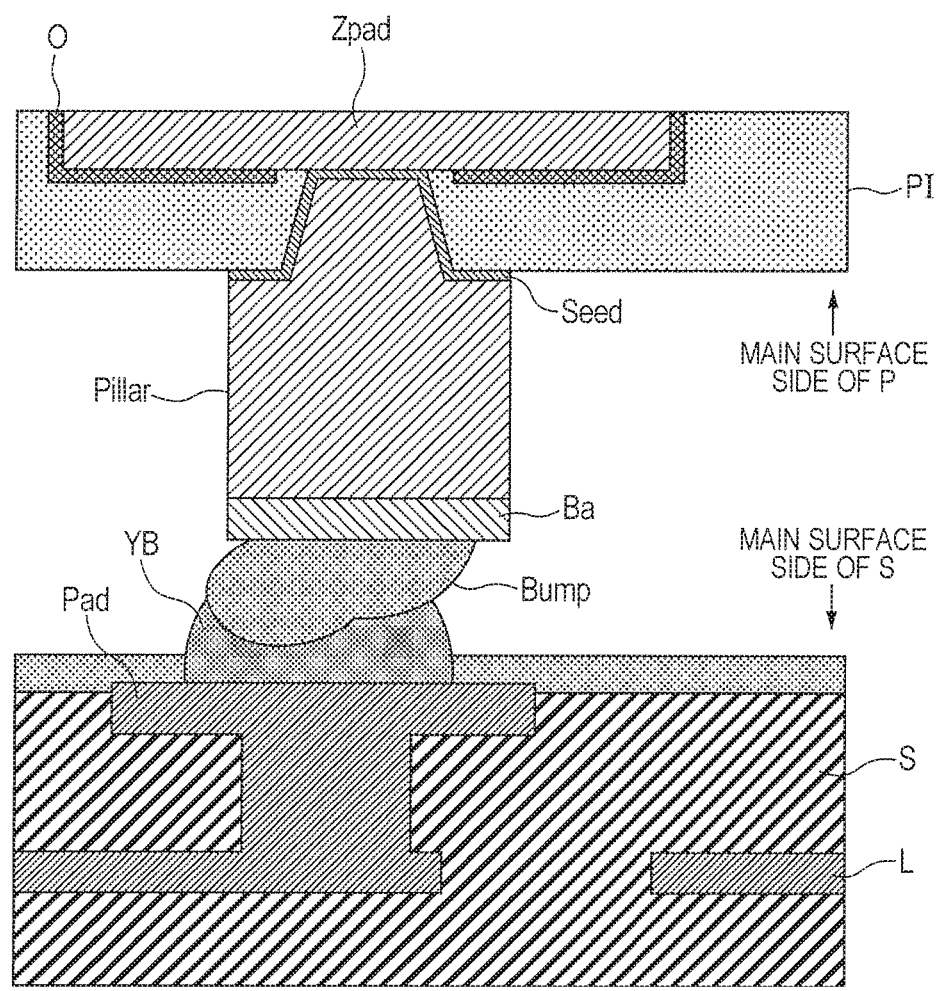
FIG. 5 is an enlarged sectional view of the B portion in FIG. 2.
Figure 6:
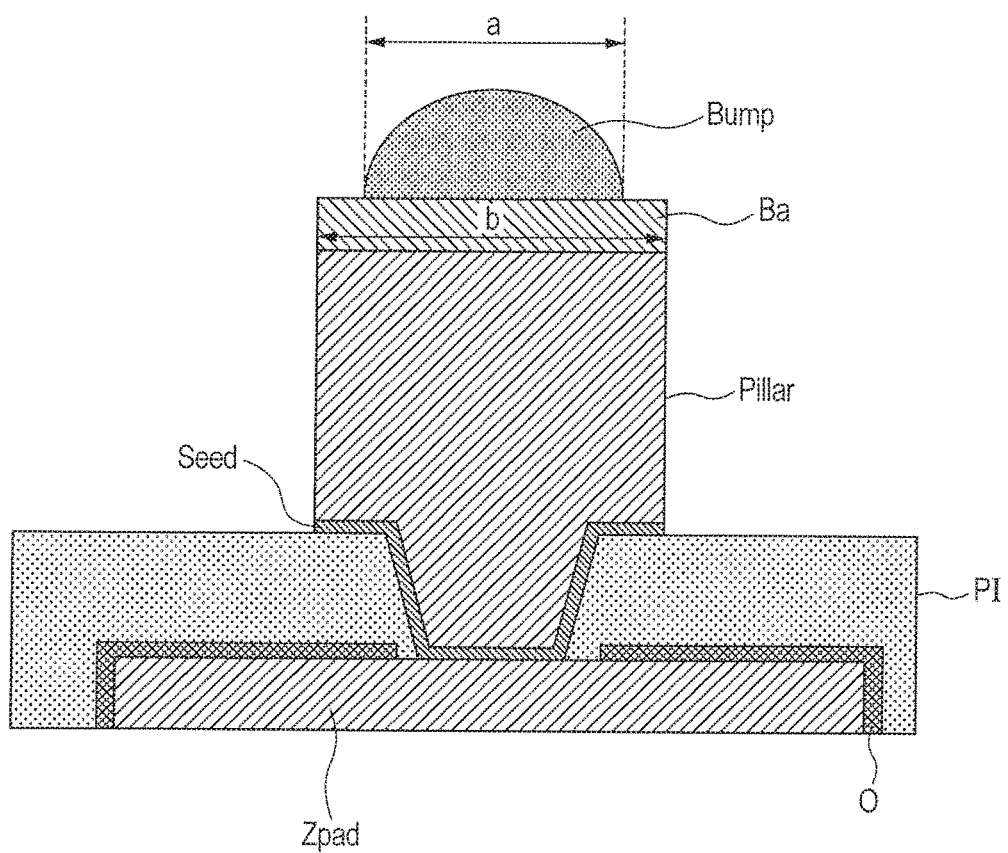
FIG. 6 is a sectional view illustrating an electrode terminal according to one embodiment of the invention.
Figure 7:
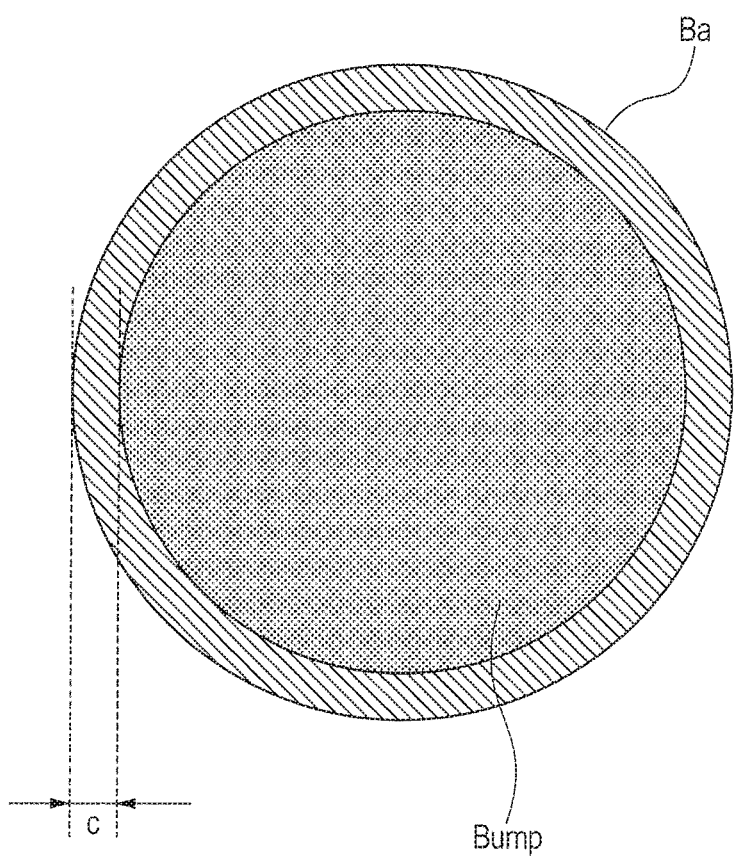
FIG. 7 is a plan view illustrating the electrode terminal according to the one embodiment of the invention.

Flip-chip mounting using a Cu pillar in the present embodiment will be described with reference to FIGS. 1 to 7. FIGS. 1 and 2 are schematic configuration views of a semiconductor device in which a flip-chip structure is adopted. FIG. 1 is a plan view of the semiconductor device, while FIG. 2 is a sectional view, taken along A-A' Line in FIG. 1. FIG. 3 is an enlarged view of a semiconductor pellet P in FIG. 1, while FIG. 4 is a sectional view, taken along C-C' Line in FIG. 3. FIG. 5 is an enlarged view of the B portion in FIG. 2. FIG. 6 is a cross-sectional view of an electrode terminal ZZ in FIG. 4, while FIG. 7 is a plan view of the electrode terminal ZZ, obtained when the semiconductor pellet P is viewed from the main surface side thereof.

In the semiconductor device according to the present embodiment, the semiconductor pellet P is mounted over a base substrate S that is a mounting board via the electrode terminal ZZ, as illustrated in FIGS. 1 and 2. A main surface of the base substrate S and that of the semiconductor pellet P face each other, and the semiconductor pellet P is mounted over the base substrate S by bonding the electrode terminal ZZ formed on the main surface side of the semiconductor pellet P to the main surface of the base substrate S.

As illustrated in FIGS. 3 and 4, a plurality of the electrode terminals ZZ are provided on the main surface side of the semiconductor pellet P so as to be adjacent to each other. FIG. 3 illustrates an example in which the electrode terminals ZZ are densely formed in a matrix pattern in the semiconductor pellet P. As described above, the pitch between electrode pads becomes narrow with the high integration of semiconductor chips, and hence the distance between the adjacent electrode terminals ZZ becomes small as illustrated in FIG. 3. Accordingly, there is the fear that, if the electrode terminal ZZ is to be bonded to the base substrate S by a related art method using solder, the solder may protrude, so that the adjacent electrode terminals ZZ may short-circuit.

Additionally, the thermal expansion coefficients of the semiconductor pellet P and the base substrate S are different from each other because their base materials are different from each other, and hence there is the fear that their positions may be laterally shifted from each other due to being heated during the mounting, so that the adjacent electrode terminals ZZ may also short-circuit.

Accordingly, in the flip-chip mounting according to the present embodiment, a bump Bump, which forms the electrode terminal ZZ formed on the main surface side of the semiconductor pellet P, is formed to be smaller than a barrier layer Ba that similarly forms the electrode terminal ZZ, as illustrated in FIG. 5.

The electrode terminal ZZ and its peripheral structure will be described in more detail with reference to FIGS. 5 to 7.

As illustrated in FIG. 5, the base substrate S is formed, for example, in a printed circuit board, and is formed by a core layer located at its center, a wiring layer L, an electrode pad Pad, and solder YB. The wiring layer L and the electrode pad Pad are formed, for example, by an Al (aluminum) film, a Cu film, or the like.

Alternatively, when the semiconductor pellet P is mounted over the base substrate S only by the bump Bump of the electrode terminal ZZ, the solder YB may n be provided in the base substrate S.

Additionally, a substrate not using a core layer, which is referred to as a so-called coreless substrate and is formed only by a build-up layer, may be used as the base substrate S. The coreless substrate is excellent in electrical properties and has high flexibility in wiring design.

Additionally, in the electrode pad Pad, for example, an Ni film, Pt film, Au film, or the like, may be formed over a Cu film.

The semiconductor pellet P is formed mainly by a semiconductor substrate including single crystal silicon (Si), and over the main surface thereof, a logic circuit system, a memory circuit system, or a mixed circuit system thereof is mounted. The electrode terminals ZZ are arranged on the main surface side of the semiconductor pellet P, as illustrated in FIG. 4. The electrode terminals ZZ are formed over the uppermost wiring layer of a plurality of wiring layers formed over the main surface of the semiconductor substrate.

Figure 8:
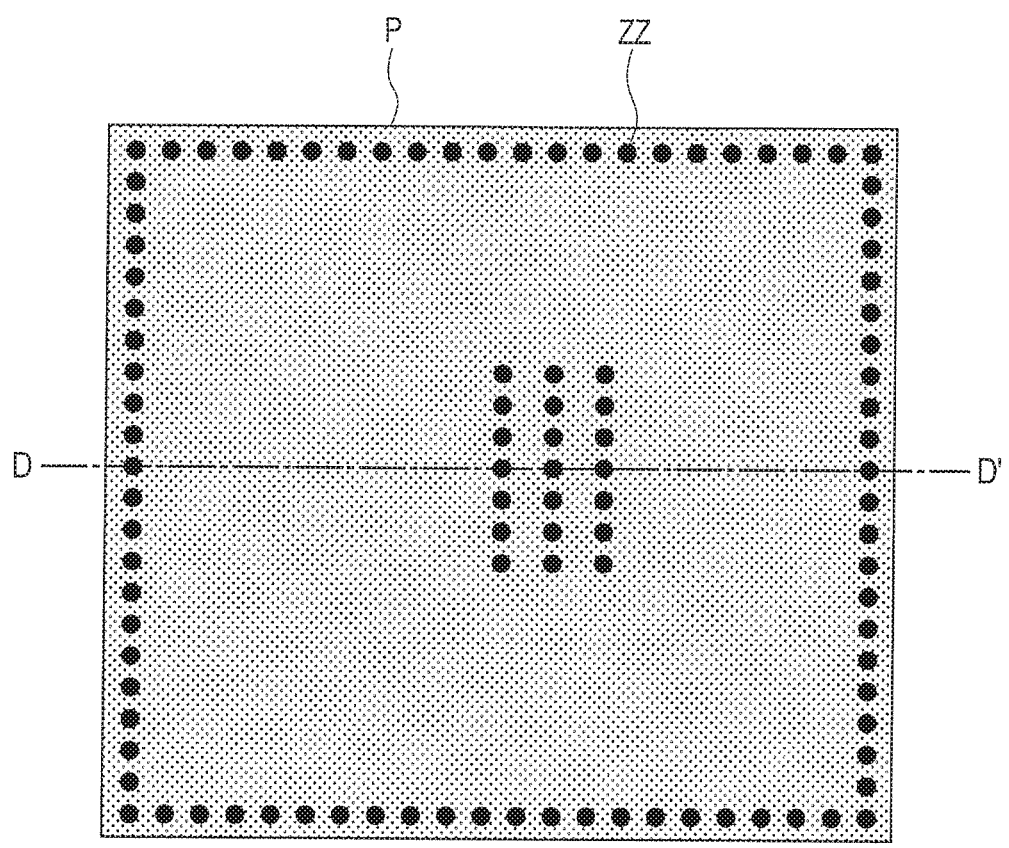
FIG. 8 is a plan view of a semiconductor pellet according to one embodiment of the invention.

The electrode terminals ZZ are arranged on the main surface side of the semiconductor pellet P at intervals of, for example, 40 μm. Alternatively, the electrode terminals ZZ may not be arranged at equal intervals, as illustrated in FIGS. 8 and 9. FIGS. 8 and 9 illustrate an example of flip-chip mounting, in which the electrode terminals ZZ are formed only in the peripheral portion and the central portion of the semiconductor pellet P.

The electrode terminal ZZ is coupled to the electrode pad Pad over the base substrate S in a state in which the main surface side of the semiconductor pellet P is oriented downward as illustrated in FIG. 5, thereby allowing the base substrate S and the semiconductor pellet P to be electrically coupled. The electrode terminal ZZ and the electrode pad Pad are coupled, for example, by thermal fusion during a reflow process.

The electrode terminal ZZ is formed by a seed layer Seed, a pillar layer Pillar, the barrier layer Ba, and the bump Bump in this order from below, i.e., from the main surface side of the semiconductor substrate.

The seed layer Seed is used when the pillar layer Pillar is formed by electrolytic plating, and is omitted when the pillar layer Pillar is formed without a seed layer, for example, as in direct plating.

FIG. 5 illustrates an example in which the electrode terminal ZZ is formed over a buffer film PI, a cover layer O, and a terminal pad Zpad; however, the electrode terminal ZZ may be formed over the cover layer C or the terminal pad Zpad.

The pillar layer Pillar is formed, for example, by a Cu film, and has a height (film thickness) of approximately 33

μm. The barrier layer Ba is formed, for example, by an Ni film, and has a height (film thickness) of approximately 3 μm. The bump Bump is formed, for example, by an SnAg film, and has a height (film thick of approximately 10 μm.

Herein, in the cross section of the semiconductor device, i.e., in the cross section of the electrode terminal ZZ, the width a of the bump Bump is formed to be smaller than the width b of the barrier layer Ba, as illustrated in FIG. 6. That is, the bump Bump is formed to be smaller than the barrier layer Ba such that the relationship of a<b is satisfied.

When the pillar layer Pillar is formed to have a cylindrical shape and when the semiconductor pellet P is planarly viewed from the main surface side thereof, each of the barrier layer Ba and the bump Bump has an approximately circular shape, and they are formed such that the diameter of the bump Bump is smaller than that of the barrier layer Ba, as illustrated in FIG. 7. The difference between the diameter of the bump Bump and that of the barrier layer Ba is illustrated as c in FIG. 7. The bump Bump is formed to be smaller than the barrier layer Ba such that the c becomes, for example, approximately 3 μm.

Herein, the difference c between the bump Bump and the barrier layer Ba may be approximately equal to or larger than the thickness of the barrier layer Ba. Additionally, the shape of the electrode terminal ZZ, obtained when the semiconductor pellet P is planarly viewed from the main surface side thereof, may be, for example, an approximately square, rectangle, octagon, or the like, other than an approximate circle.

A method of forming the electrode terminal ZZ described above will be described with reference to FIGS. 10A to 10D.

The cover layer O and a buffer layer PI are first formed over the terminal pad Zpad formed on the main surface side of the semiconductor substrate, as illustrated in FIG. 10A. Each of the cover layer O and the buffer layer PI serves as a surface protective film of the semiconductor pellet. The cover layer O is formed by an insulating film, such as, for example, a silicon nitride (SiN) film, while the buffer layer PI is formed, for example, by a polyimide resin, or the like. An opening for exposing the terminal pad Zpad from the bottom thereof is formed in each of the cover layer O and the buffer layer PI.

Subsequently, the seed layer Seed is formed on the main surface side of the semiconductor substrate by sputtering, for example, Ti and Cu in this order, so that the buffer layer PI and the exposed terminal pad Zpad are covered. When the pillar layer Pillar is formed without a seed layer by direct plating, the step of forming the seed layer Seed is omitted, as described above.

Figure 10B:
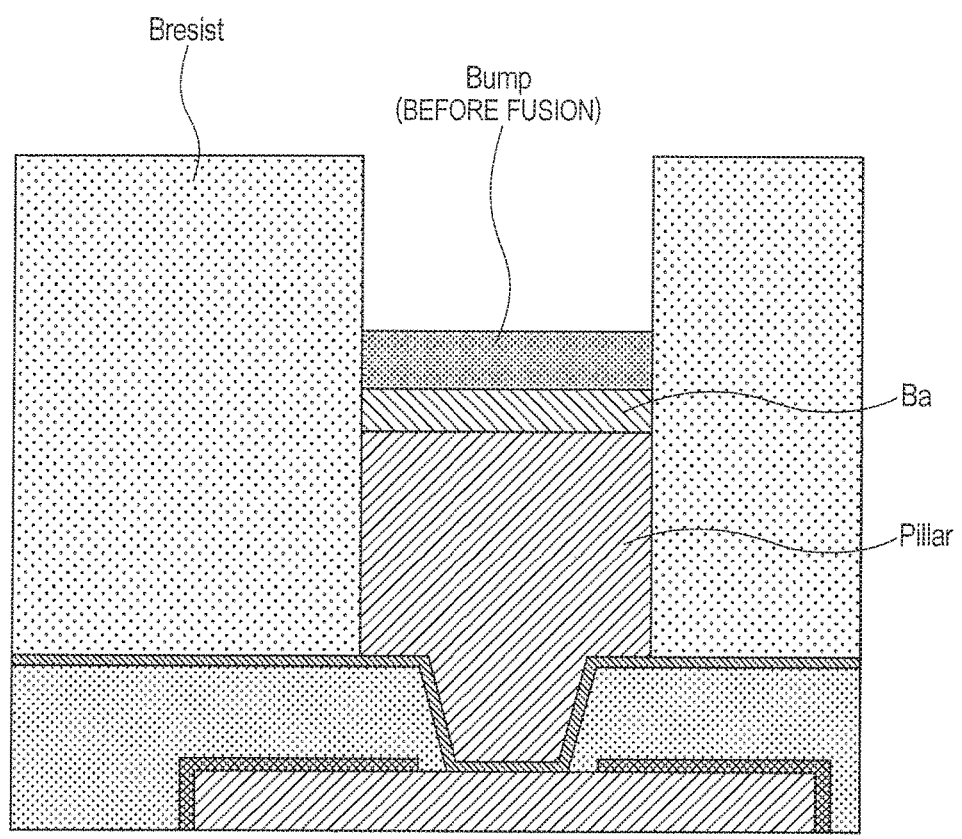
FIG. 10B is a sectional view illustrating part of the manufacturing steps of the semiconductor device according to the one embodiment of the invention.

Subsequently, a bump resist Bresist is applied over the main surface of the semiconductor substrate, and an opening for exposing, from the bottom thereof, the terminal pad Zpad (when the seed layer Seed is formed, the seed layer Seed over the terminal pad Zpad) is provided by patterning using photolithography, as illustrated in FIG. 10B.

Thereafter, a laminated film, including the pillar layer Pillar, the barrier layer Ba, and the bump Bump in this order from below, is formed in the opening by, for example, electrolytic plating.

Figure 10C:
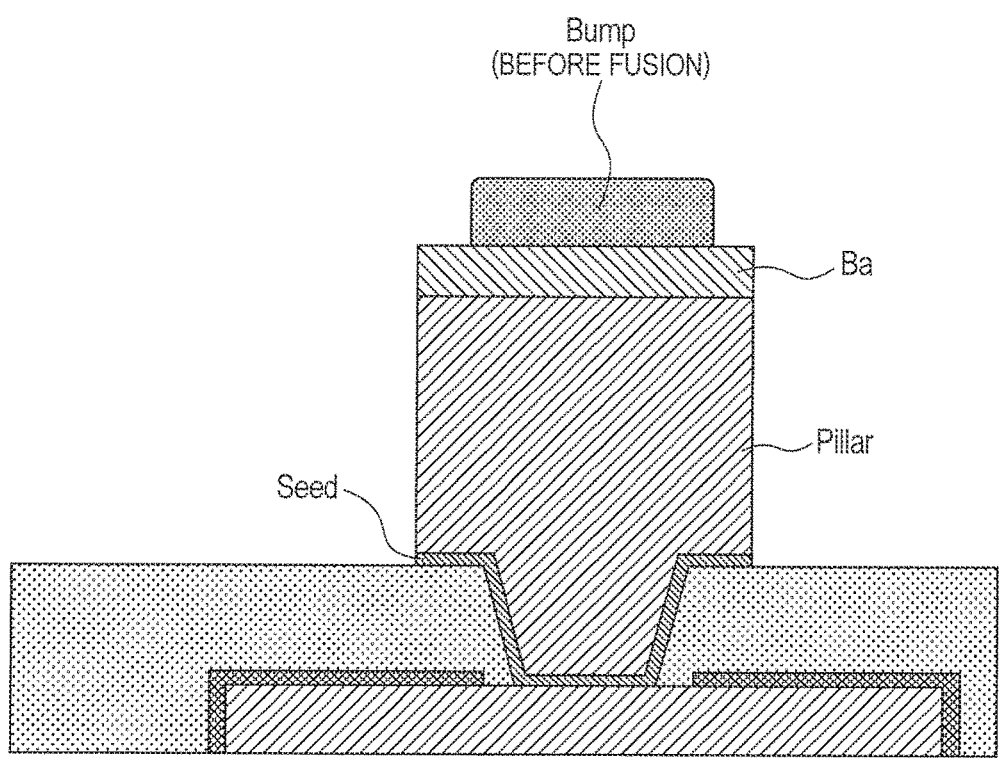
FIG. 10C is a sectional view illustrating part of the manufacturing steps of the semiconductor device according to the one embodiment of the invention.

Further, after the bump resist Bresist is removed by ashing using, for example, $O_2$ plasma, the Cu of the seed layer Seed other than that located below the pillar layer Pillar is removed, for example, by an SPM treatment (cleaning by a mixed liquid of sulfuric acid/hydrogen peroxide), and the outer peripheries (surfaces) of the Ti and the bump Bump are wet etched by, for example, DHF (dilute hydrofluoric acid), as illustrated in FIG. 10C.

Figure 10D:
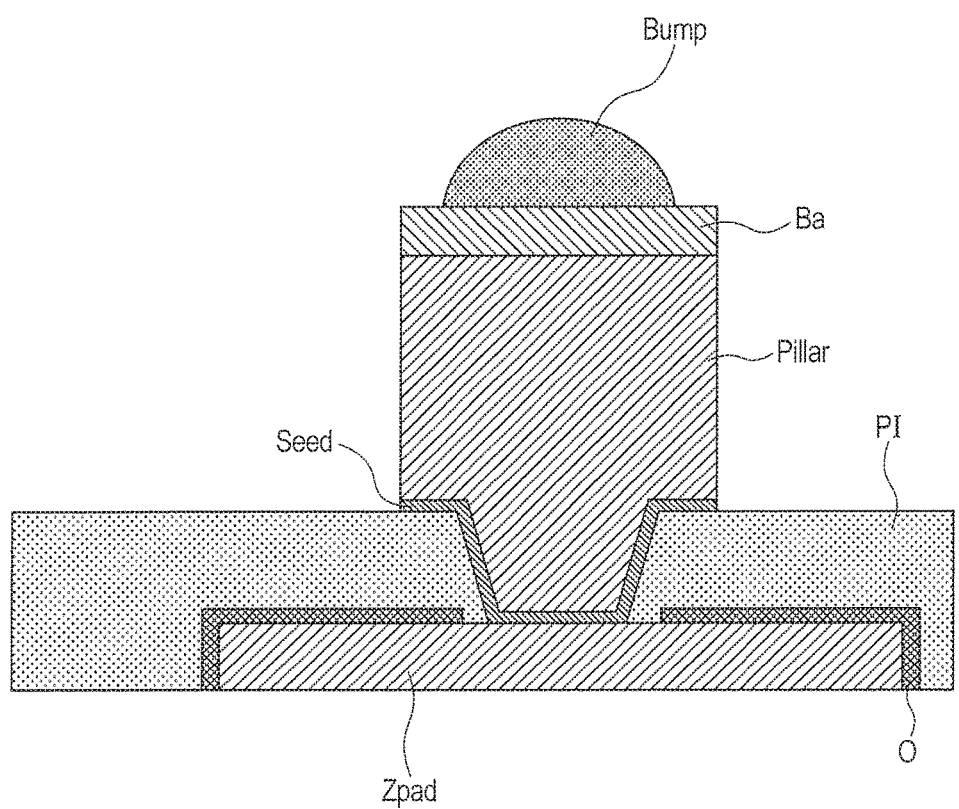
FIG. 10D is a sectional view illustrating part of the manufacturing steps of the semiconductor device according to the one embodiment of the invention.

Finally, the bump Bump is reflowed by a heat treatment, so that the electrode terminal ZZ is formed into a desired shape, as illustrated in FIG. 10D.

It can be considered that a variation may be caused in the wet etching amounts occurring when the outer periphery (surface) of the bump Bump is wet etched by DHF (dilute hydrofluoric acid) due to a difference between sparse and close arrangement of the electrode terminals ZZ; however, the variation can be reduced by arranging, for example, two rows of dummy electrode terminals around a region where the electrode terminals ZZ are sparsely arranged.

According to the flip-chip mounting using a Cu pillar of the present embodiment, wet rise of solder over the sidewall of a pillar layer can be suppressed by forming a bump so as to be smaller than a barrier layer in a laminated structure including the pillar layer, the barrier layer and the bump that form the Cu pillar, as described above.

Further, even if the position of the base substrate S is laterally shifted from that of the semiconductor pellet P due to a difference between the thermal expansion coefficients thereof while they are being bonded together, the progression of the bump Bump, in which the bump Bump may reach the pillar layer Pillar after extending beyond the end portion of the barrier layer Ba and further extend toward the main surface side of the semiconductor substrate, can be suppressed by providing a region of the barrier layer Ba at the outer periphery of the bump Bump.

Furthermore, the solder (bump) wettability of the surface of the barrier layer Ba is lower than that of the surface of the pillar layer Pillar, and hence even if the position of the base substrate S is laterally shifted from that of the semiconductor pellet P due to a difference between the thermal expansion coefficients thereof while they are being bonded together, a lateral movement of the bump Bump is suppressed by the barrier layer Ba having lower wettability, thereby allowing a short circuit with the adjacent bump Bump to be suppressed.

Second Embodiment

An electrode terminal ZZ according to Second Embodiment and a method of forming it will be described with reference to FIGS. 11A to 11D.

Figure 11A:
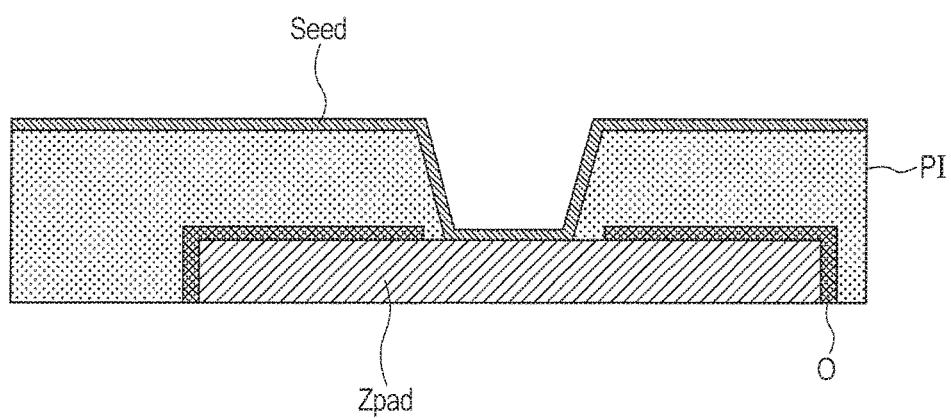
FIG. 11A is a sectional view illustrating part of the manufacturing steps of the semiconductor device according to the one embodiment of the invention.

The structure illustrated in FIG. 11A is first formed in the same way as in FIG. 10A in First Embodiment.

Figure 11B:
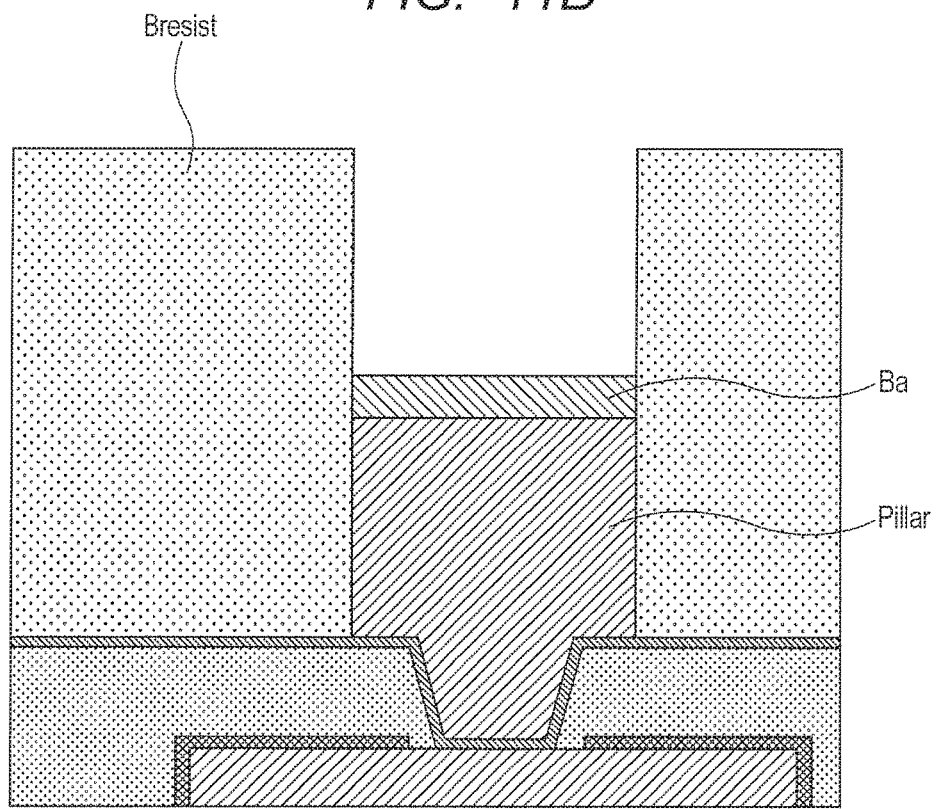
FIG. 11B is a sectional view illustrating part of the manufacturing steps of the semiconductor device according to the one embodiment of the invention.

Subsequently, the bump resist Bresist is applied over the main surface of the semiconductor substrate, and an opening (first opening) for exposing, from the bottom thereof, the terminal pad Zpad (when the seed layer Seed is formed, the seed layer Seed over the terminal pad Zpad) is provided by patterning using photolithography, as illustrated in FIG. 11B.

Thereafter, a laminated film, including the pillar layer Pillar and the barrier layer Ba in this order from below, is formed in the opening (first opening) by, for example, electrolytic plating.

Figure 11C:
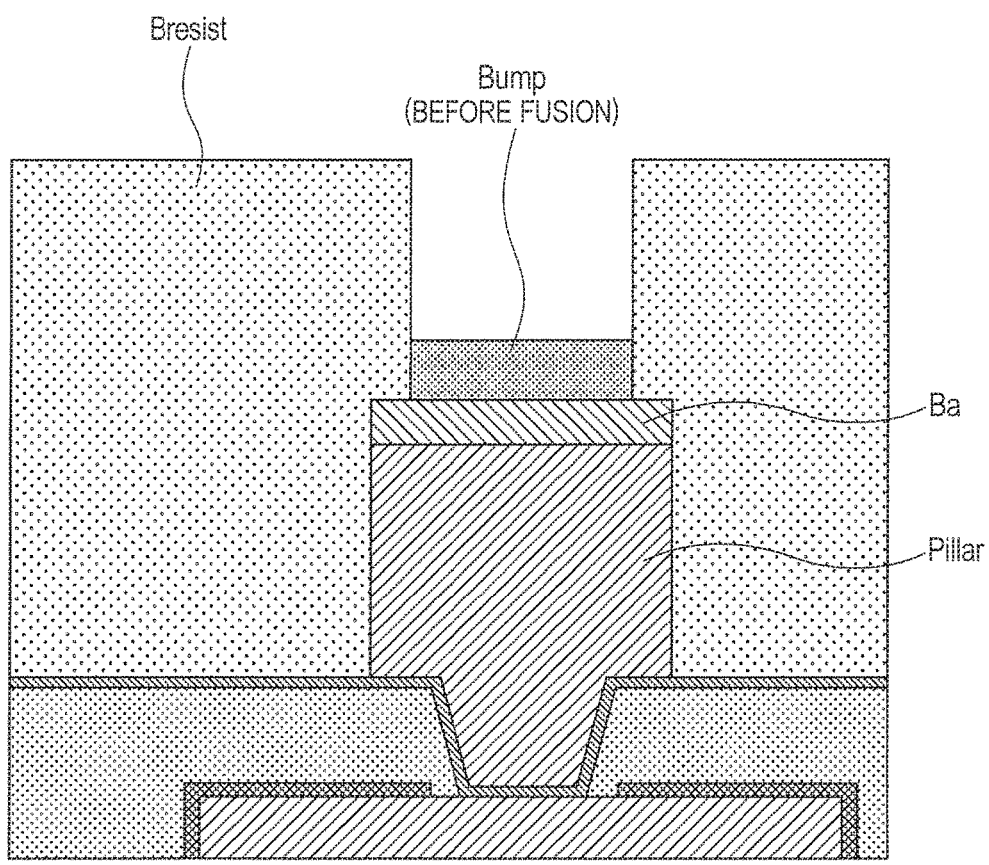
FIG. 11C is a sectional view illustrating part of the manufacturing steps of the semiconductor device according to the one embodiment of the invention.
Figure 11D:
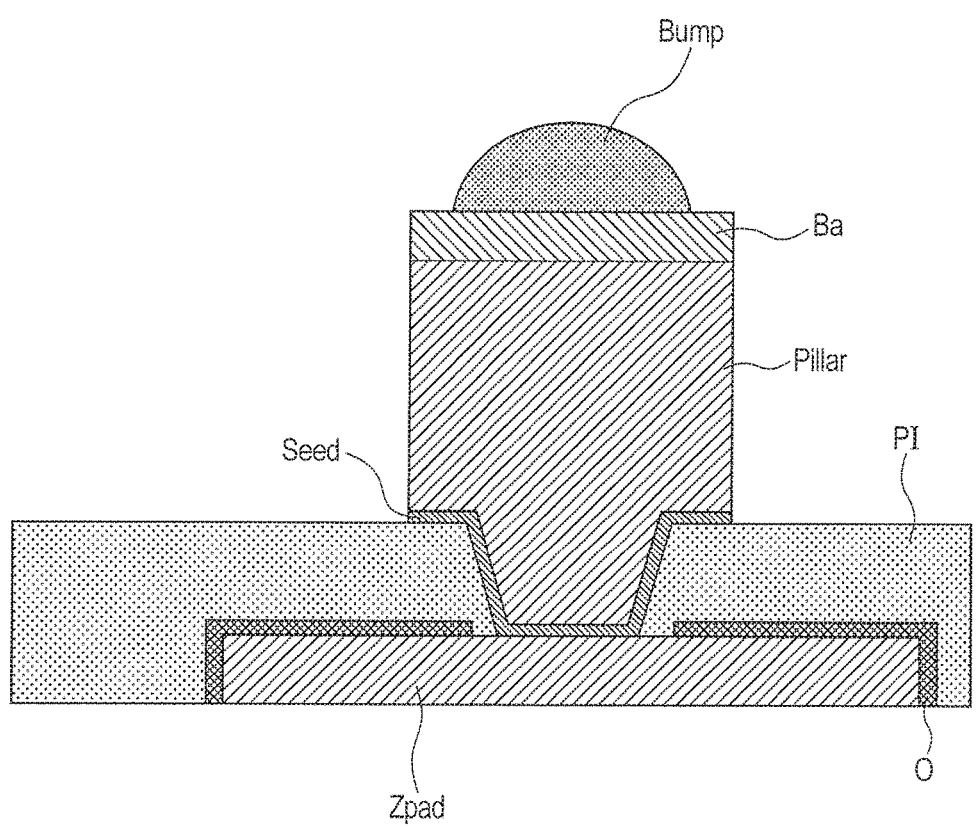
FIG. 11D is a sectional view illustrating part of the manufacturing steps of the semiconductor device according to the one embodiment of the invention.

Subsequently, after the bump resist Bresist is removed by ashing using, for example, $O_2$ plasma, the bump resist Bresist is again applied over the main surface of the semiconductor substrate so as to cover the seed layer Seed, the pillar layer Pillar, and the barrier layer Ba, as illustrated in FIG. 11C.

Further, an opening (second opening) for exposing the barrier layer Ba from the bottom thereof, the opening having an opening diameter smaller than that of the first opening, is provided by patterning using photolithography. Thereafter, the surface of the barrier layer Ba exposed at the bottom of the opening is cleaned, for example, by HCl, and the bump Bump is formed in the opening (second opening) and over the barrier layer Ba by, for example, electrolytic plating.

Subsequently, after the bump resist Bresist is removed by ashing using, for example, $O_2$ plasma, the Cu of the seed layer Seed other than that located below the pillar layer Pillar is removed, for example, by an SPM treatment (cleaning by a mixed liquid of sulfuric acid/hydrogen peroxide), and the outer peripheries (surfaces) of the Ti and the bump Bump are wet etched by, for example, DEP (dilute hydrofluoric acid).

Finally, the bump Bump is reflowed by a heat treatment, so that the electrode terminal ZZ is formed into a desired shape, as illustrated in FIG. 10D.

In First Embodiment, the pillar layer Pillar, the barrier layer Ba, and the bump Bump are formed, at a time, in the opening provided by patterning the bump resist Bresist, as illustrated in FIG. 10B, while in the present embodiment, the pillar layer Pillar and the barrier layer Ba of the electrode terminal ZZ and the bump Bump are formed in different steps.

As described above, an opening (second opening), which is to be provided in the bump resist Bresist in order to form the bump Bump, is formed such that the opening diameter thereof is smaller than that of an opening (first opening) to be provided in the bump resist Bresist in order to form the pillar layer Pillar and the barrier layer Ba. Thereby, the bump Bump is formed to be smaller than the barrier layer Ba.

That is, in the relationship between the size (second opening diameter) of an opening (second opening) to be provided in the bump resist Bresist in order to form the bump Bump and the size (first opening diameter) of an opening (first opening) to be provided in the bump resist Bresist in order to form the barrier layer Ba and the pillar layer Pillar that are located below, the relationship of the first opening diameter>the second opening diameter should be satisfied.

Herein, the position of the second opening with respect to the first opening, i.e., the position of the bump Bump with respect to the barrier layer Ba is adjusted by the photolithography performed when an opening is provided by patterning the bump resist Bresist.

According to the method of forming the electrode terminal ZZ of the present embodiment, the positional relationship between the barrier layer Ba of the electrode terminal ZZ and the bump Bump can be individually set, so that they can be formed to be secure a space having a required width in an appropriate direction, as described above.

That is, an amount of solder and a larger margin can be secured only in a direction in which wet rise is likely to be caused, by intentionally shifting the bump Bump (solder) from the center of a pillar layer so as to secure a larger space.

Further, the size of a bump and a position where it is to be formed can be controlled more precisely and a required space can be formed in an appropriate direction, in comparison with the electrode terminal ZZ of First Embodiment, thereby allowing increased miniaturization to be dealt with.

Additionally, it can be expected that, when a mounting board and a semiconductor chip are generally bonded together, the position of the reception side (land) of the mounting board may be shifted from that of the coupling terminal (pillar) of the semiconductor chip due to a difference between the thermal expansion coefficients thereof. Accordingly, an amount of the shift can be reduced by bonding them at the centers thereof with the position of the bump Bump (solder) being shifted in advance, thereby allowing a margin to be secured.

Third Embodiment

Figure 12:
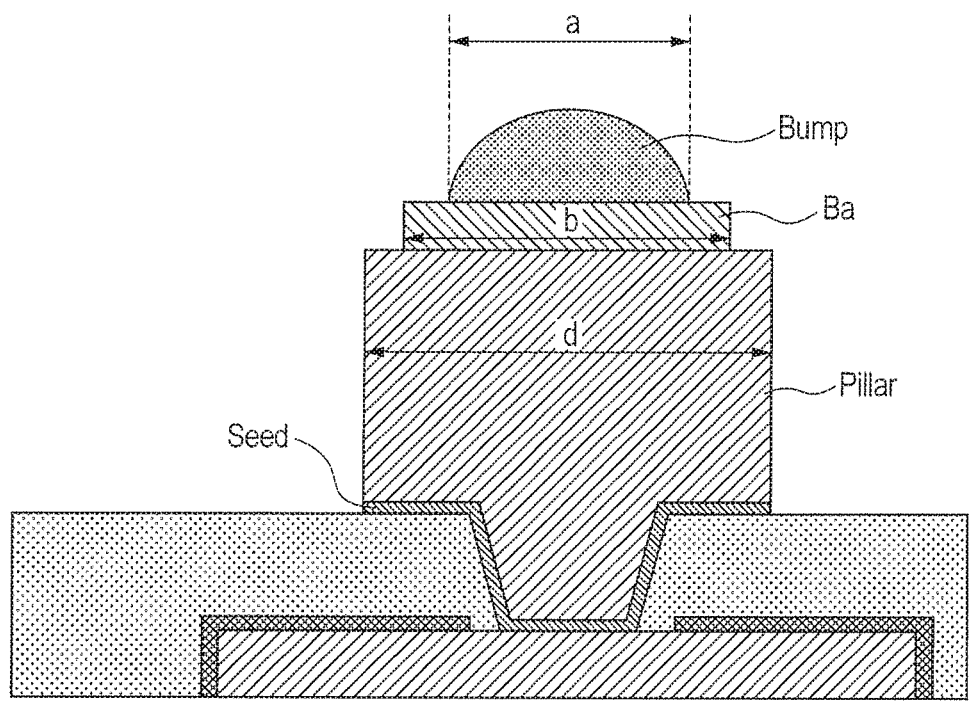
FIG. 12 is a sectional view illustrating an electrode terminal according to one embodiment of the invention.
Figure 13:
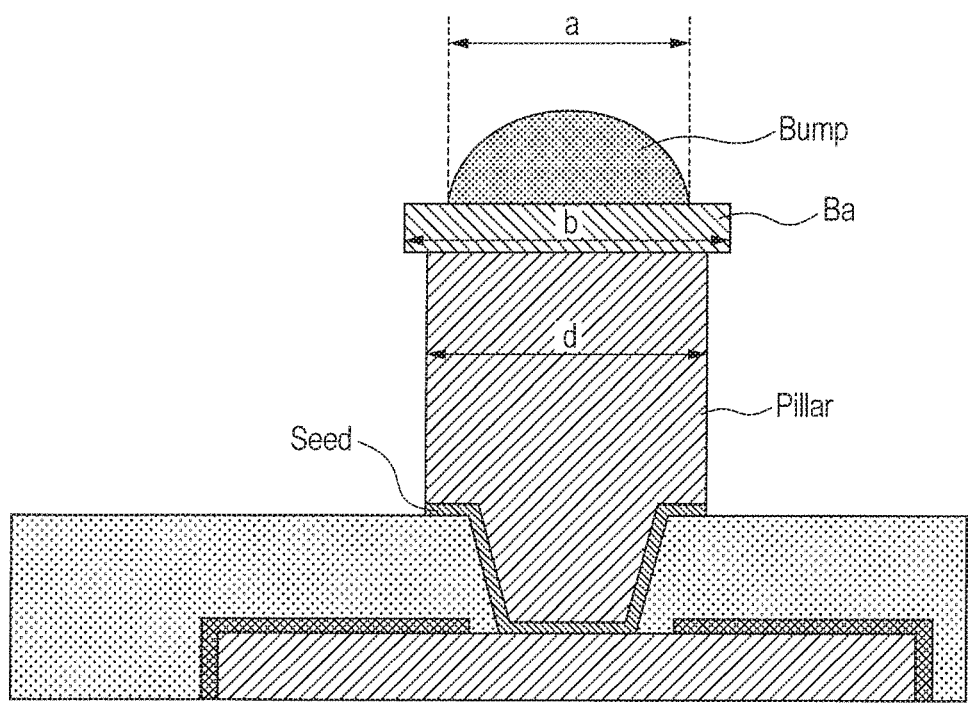
FIG. 13 is a sectional view illustrating an electrode terminal according to one embodiment of the invention.

Electrode terminals ZZ according to Third Embodiment will be described with reference to FIGS. 12 and 13. The electrode terminals ZZ illustrated in FIGS. 12 and 13 are variations of the electrode terminal ZZ described with reference to FIG. 6. The electrode terminal ZZ of FIG. 6 is formed such that: the width a of the bump Bump and the width b of the barrier layer Ba satisfy the relationship of a<b; and the width of the pillar layer Pillar is almost the same as the width b of the barrier layer Ba.

On the other hand, the electrode terminal ZZ illustrated in each of FIGS. 12 and 13 is formed such that: the width a of the bump Bump and the width b of the barrier layer Ba satisfy the relationship of a<b, similarly to FIG. 6; but the width d of the pillar layer Pillar is different from the width b of the barrier layer Ba.

In the electrode terminal ZZ of FIG. 12, the relationships of a<b and b<d are both satisfied. That is, the relationship of a<b<d is satisfied. By forming the electrode terminal ZZ such that: the diameter of the bump Bump is smaller than that of the barrier Ba; and the diameter of the pillar layer Pillar is larger than that of the barrier Ba, wet rise of solder over the sidewall of the pillar layer can be suppressed and the stress generated in a bonded portion between the pillar layer Pillar and the semiconductor pellet P can be dispersed, thereby allowing the reliability of the Cu pillar to be improved.

Further, by making the diameter d of the pillar layer Pillar larger, the close contact area with the semiconductor pellet P can be increased, because the diameter a of the bump Bump is determined by the barrier layer Ba having lower solder wettability. In this case, any one of the close contact areas of the buffer layer Pi, the cover layer O, and the terminal pad Zpad may be increased.

Furthermore, the width of the bump Bump and the close contact area with the semiconductor pellet P can be individually set, and hence a narrow pitch can be dealt with and the reliability can be improved.

In the electrode terminal ZZ of FIG. 13, the relationships of a<b and b>d are satisfied. By forming the electrode terminal ZZ such that: the diameter of the bump Bump is smaller than that of the barrier Ba; and the diameter of the pillar layer Pillar is smaller than that of the barrier Ba, wet rise of solder over the sidewall of the pillar layer can be suppressed and the pitch between the terminal pads Zpad provided in the main surface of the semiconductor pellet P can be narrowed.

Herein, the electrode terminals ZZ illustrated in FIGS. 12 and 13 can be formed, for example, by repeating the steps of applying the bump resist Bresist, forming an opening, and performing electrolytic plating in order to form each layer. That is, the electrode terminals ZZ can be formed by forming each layer the pillar layer Pillar, the barrier layer Ba, and the bump Bump by the steps of: applying the bump resist Bresist; providing an opening for exposing the lower layer from the bottom thereof with the use of photolithography; and forming, in the opening, a film that forms the each layer with the use of electrolytic plating.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A manufacturing method of a semiconductor device, comprising the steps of:
   (a) applying a resist film having an opening over a terminal pad formed over a semiconductor substrate;
   (b) forming a pillar layer, a barrier layer, and a bump in the opening in this order from below;

(c) removing the resist film;
(d) etching outer peripheries of the bump; and
(e) reflowing the bump by a heat treatment such that a width of the bump is smaller than that of the barrier layer in a cross section of the semiconductor device.

2. The manufacturing method of a semiconductor device according to claim 1,
wherein, in the step (d), the etching is performed by using dilute hydrofluoric acid.

3. The manufacturing method of a semiconductor device according to claim 1,
wherein, in the step (b), the pillar layer, the barrier layer, and the bump are formed by electrolytic plating.

4. The manufacturing method of a semiconductor device according to claim 1,
wherein, in the step (c), the resist film is removed by ashing.

5. The manufacturing method of a semiconductor device according to claim 1,
wherein, in the step (d), the outer peripheries of the bump are wet etched.

6. The manufacturing method of a semiconductor device according to claim 1,
wherein the pillar layer is a Cu film,
wherein the barrier layer is an Ni film, and
wherein the bump is an SnAg film.

7. A manufacturing method of a semiconductor device, comprising the steps of:
(a) applying a first resist film over a terminal pad formed over a main surface of a semiconductor substrate;
(b) forming a first opening in the first resist film for exposing the terminal pad in the bottom thereof;
(c) forming a pillar layer and a barrier layer in this order from below;
(d) removing the first resist film;
(e) applying a second resist film over the terminal pad, the pillar layer, and the barrier layer;
(f) forming a second opening in the second resist film for exposing the barrier layer in the bottom thereof;
(g) forming a bump in the second opening; and
(h) removing the second resist film.

8. The manufacturing method of a semiconductor device according to claim 7,
wherein a diameter of the second opening is smaller than that of the first opening.

9. The manufacturing method of a semiconductor device according to claim 7,
wherein, in the step (b), the first opening is formed by photolithography.

10. The manufacturing method of a semiconductor device according to claim 7,
wherein, in the step (c), the pillar layer and the barrier layer are formed by electrolytic plating.

11. The manufacturing method of a semiconductor device according to claim 7,
wherein, in the step (d), the first resist film is removed by ashing.

12. The manufacturing method of a semiconductor device according to claim 7,
wherein, in the step (f), the second opening is formed by photolithography.

13. The manufacturing method of a semiconductor device according to claim 7,
wherein, in the step (g), the bump is formed by electrolytic plating.

14. The manufacturing method of a semiconductor device according to claim 7,
wherein, in the step (h), the second resist film is removed by ashing.

15. The manufacturing method of a semiconductor device according to claim 7,
wherein the pillar layer is a Cu film,
wherein the barrier layer is an Ni film, and
wherein the bump is an SnAg film.

* * * * *